United States Patent [19]

Park et al.

[11] Patent Number: 5,017,265

[45] Date of Patent: May 21, 1991

[54] METHOD FOR REMOVING RESIDUAL MATERIAL FROM A CAVITY DURING THE MANUFACTURE OF A SEMICONDUCTOR DEVICE BY UTILIZING PLASMA SCATTERING

[75] Inventors: Hae S. Park; Sang I. Kim; Sea C. Kim; Kye S. Park; Jin G. Park, all of Seoul, Rep. of Korea

[73] Assignee: Hyundai Electronics Industries Co., Ltd., Ichon-Kuni, Rep. of Korea

[21] Appl. No.: 453,593

[22] Filed: Dec. 20, 1989

[30] Foreign Application Priority Data

Dec. 20, 1988 [KR] Rep. of Korea ............... 88-17007

[51] Int. Cl.$^5$ ............... H01L 21/306; B44C 1/22; C03C 15/00; C03C 25/06
[52] U.S. Cl. ............... 156/643; 134/1; 156/646; 156/651; 156/657; 156/659.1; 156/662; 204/192.37; 252/79.1; 437/228; 437/233
[58] Field of Search ............... 156/643, 644, 646, 650, 156/651, 652, 657, 659.1, 662; 204/192.32, 192.35, 192.37; 427/38, 39; 437/228, 233; 134/1; 252/79.1

[56] References Cited

U.S. PATENT DOCUMENTS

| | | | |
|---|---|---|---|
| 4,341,594 | 7/1982 | Carlson et al. | 156/646 X |
| 4,502,915 | 3/1985 | Carter et al. | 156/651 X |
| 4,528,066 | 7/1985 | Merkling et al. | 156/651 X |
| 4,806,199 | 2/1989 | Gualandris | 156/651 X |
| 4,808,259 | 2/1989 | Jillie et al. | 156/651 X |
| 4,818,334 | 4/1989 | Shwartzman et al. | 156/651 X |

*Primary Examiner*—William A. Powell

[57] ABSTRACT

A method for removing residual material which remains in a cavity after an anisotropic etching process in the manufacture of a partially completed multi-layer semiconductor device, where the cavity is in contact with at least one anisotropic etch-stop layer and is accessible by an etchable layer is disclosed. A plasma etching apparatus which includes a chamber is utilized. The etchable layer is first etched by anisotropic etching in the chamber under predetermined conditions in the plasma etching apparatus until a top of the etch-stop layer is exposed. A plasma scattering etching process is then performed to remove the residual material in the cavity by changing the predetermined conditions of the anisotropic etching process to produce plasma scattering, thereby removing the residual material from the cavity.

4 Claims, 1 Drawing Sheet

METHOD FOR REMOVING RESIDUAL MATERIAL FROM A CAVITY DURING THE MANUFACTURE OF A SEMICONDUCTOR DEVICE BY UTILIZING PLASMA SCATTERING

BACKGROUND OF TE INVENTION

Field of Invention

This invention relates to a method which utilizes plasma scattering for removing residual materials which remain in a cavity of a multi-layered semiconductor device on which respective patterns have been formed after an etching process has been performed.

In the process for manufacturing multi-layered semiconductor memory devices having a capacity of more than 1 mega bit, cavities are formed in the semiconductor device. Accordingly, residual materials which should be removed upon etching remains in the cavity. Such residual anisotropic etchable material is an impurity which affects the property of memory device and should be removed to improve the quality of the device.

In the prior art, methods for removing the residual anisotropic etchable material in the cavities of a semiconductor device are as follows:

The first, extending the etching time to remove the residual materials. However, this attempt presents a problem in that if the selectivity of the etching solution is low, other films, which must not be etched, are etched. Thus, the selectivity if the etching solution toward the materials must be extremely high and be extremely low toward the other films in order not to etch the necessary portions of the other films.

The second, performing an additional mask pattern process and an additional etching process on only the residual material contained in the cavity in order to remove the residual material. That is, the residual, material to be removed from the cavity and the top the adjacent film (of the other material) are coated with a photoresistive film. Then a portion of the photoresistive film positioned on the residual material contained in the cavity is removed. Then, an additional etching process is performed to remove the residual material from the cavity.

Therefore, the process for removing the residual material is complicated because such process requires the additional formation of photoresistive film and an additional etching step. Also, the mask pattern forming process should be performed very carefully so that a resulting delay in the process for manufacturing the semiconductor device occurs.

Therefore, it is an object of the present invention to solve the problems presented in above mentioned prior art methods.

It is a further object of the present invention to provide a method for removing residual material in a cavity of the semiconductor device by utilizing plasma scattering.

SUMMARY OF THE INVENTION

The purposes of summarizing the present invention, it is a method for removing residual material which remains in a cavity after an anisotropic etching process in the manufacture of a partially completed multi-layer semiconductor device, the cavity being in contact with at least on etch-stop layer and where the cavity is accessible by an etchable layer. The method comprises providing a plasma etching apparatus having a chamber to receive the semiconductor device. A layer on the semiconductor device is etched by anisotropic etching utilizing the plasma etching apparatus under predetermined conditions in the chamber of the plasma etching apparatus until the top of the etch-stop layer is exposed. A plasma scattering etching process is performed by changing the predetermined conditions of the anisotropic etching process to produce plasma scattering upon completion of the exposure of the top of the etch-stop layer, thereby removing the residual material from the cavity positioned in an etch-stop layer.

Preferably, the predetermined conditions of the anisotropic etching process utilizing plasma gas are: a chamber pressure of 280 m Torr, a chamber RF power supply of 250 watt and a chamber mixture of gases being in a ratio of 100: 150 ($CCL_4$: He).

Preferably, the conditions of the plasma etching process are: a chamber pressure of 300 m Torr, a chamber RF power supply of 250 watt and a chamber mixture of gases being in a ratio of 100:150:6 ($CCL_4$:HE:$SF_6$).

BRIEF DESCRIPTION OF THE DRAWINGS

For fuller understanding of the nature and objects of the invention, reference should be made to the following detailed description taken in conjunction with the accompanying drawings in which.

The novel feature of the present invention may be understood from the accompanying description when taken in conjunction with the accompanying drawings

DETAILED DESCRIPTION

Figure 1:
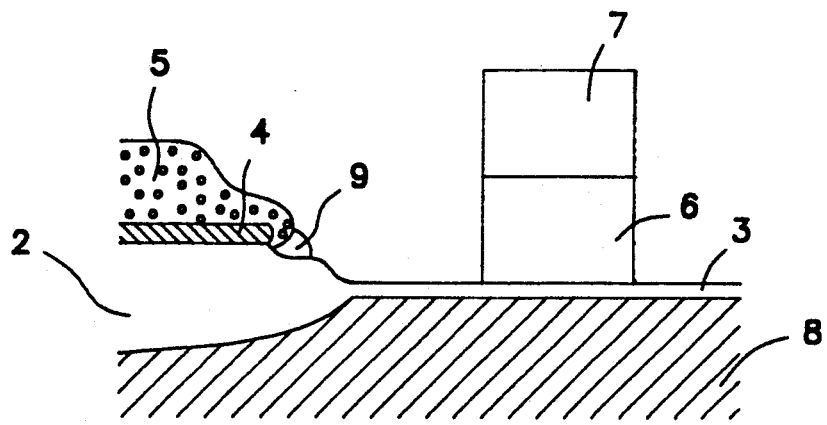
FIG. 1 illustrates a cross-section of a semiconductor device in which residual material remains after an etching process has been performed; and, FIG. 2 illustrates a cross-section of a semiconductor device in which there residual material has been removed by the method of the present invention.

FIG. 1 illustrates a cross-section of a semiconductor device in which residual material 9 remains after an etching process has been performed. A field oxide film 2, a first polysilicon layer 4 and an oxide film 5 for insulation are formed in sequence on a portion of a silicon substrates 8 as shown. A gate oxide film 3 is formed on the silicon substrate 8 with one side being in contact with the field oxide film 2. A second polysilicon layer 6 and a photoresistive film 7 are formed sequentially on the entire surface of the structure. Then, a mask pattern process is performed on a portion of the photoresistive film 7, and a portion of the polysilicon layer 6 is removed by anisotropic etching, thereby forming both a second polysilicon layer 6.

However, in the prior art process, a residual material 9, which should be removed completely, remains in a cavity positioned at the right side of the first polysilicon layer as shown in FIG. 1.

Figure 2:
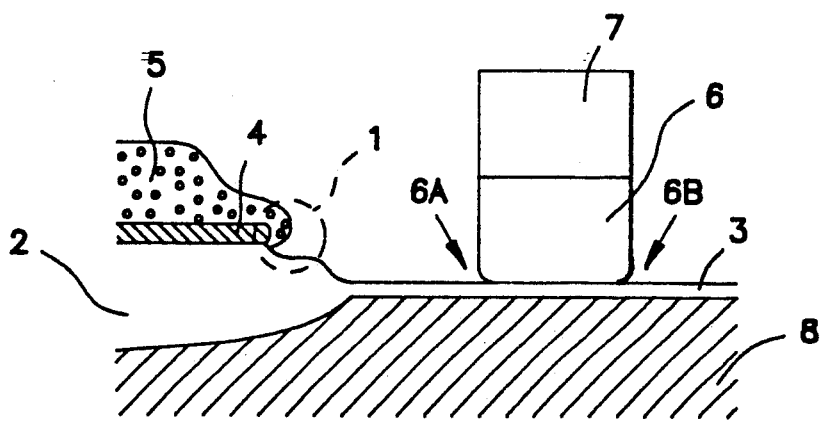

FIG. 2 illustrates a semiconductor device in which the residual material positioned at the encircled region, that is in the cavity 1, is removed completly in accordance with the method of the present invention.

A field oxide film 2, a first polysilicon layer 4 and an oxide film 5 for insulation are formed in sequence on a left portion of a silicon substrate 8. A gate oxide film 3 is formed on a right portion of the substrate 8 with one side being in contact with the field oxide film 2. A second polysilicon layer 6 is then deposited and a photoresistive film 7 is deposited on the second polysilicon layer 6. Then, after the second polysilicon layer 6 and the photoresistive film 7 are removed by the mask pattern process leaving a portion of both layers as shown in FIG. 2, the portion of the second polysilicon layer 6, at which the photoresistive layer 7 is removed, is etched according to the present invention, thereby etching away the residual material 9 remaining in the cavity 1 of semiconductor device.

The process for etching the undesirable portions of the second polysilicon layer 6 utilizes a planar plasma etching apparatus for anisotropic etching thereof until the gate oxide film 3 is exposed, under the conditions that the pressure in the chamber is 280 m Torr and the RF (radio frequency) power supply in the chamber is 250 watt and the distance between the cathode and anode electrode in the chamber is 1.5 Cm (the total distance between electrodes is from 0.3 to 2.5 Cm) and the gas mixture is the chamber present in a ratio of 100:150 ($CCL_4$:He) SCCM, (standard cc/min.).

In order to produce a scattering of the plasma on the top surface of the gate oxide film 3, in the chamber the selection of gases, the ratio of the mixture of the gases and the pressure are changed to, for example, 100:150:6 ($CCL_4$:He:$SF_6$) SCCM gas and 300 mtorr, respectively, and the distance between the electrodes and the RF power supply are maintained as in the anisotropic process, above. Then, the plasma scattering is initiated on the surface of the plasma etch-stop layers i.e. layers 2, 4 and 5, thereby removing the residual material 9 left in the cavity 1 as illustrated at FIG. 2. At this moment, a portion 6A, 6B of the bottom of the second polysilicon layer 6 is also etched.

Accordingly, according to the present invention, after the etching of the film, i.e. the second polysilicon layer 6 is completed, the residual material denoted by 9 in FIG. 1 is removed by proceeding further the etching process for removing the second polysilicon layer 6 with the change in the conditions for the plasma etching apparatus. In other word, the plasma scattering resulting from such change in the conditions makes it possible to remove the residual material.

Since the residual material is removed by the plasma scattering, excessive etching of other layers on the device does not occur so that the disadvantages of the prior art can be alleviated by including the plasma scattering artificially so that the products can be produced economically.

The first etching process and the second plasma scattering etching process are known to those skilled in the art. The present invention is enbodied in the sequence of performing the anisotropic process step first, followed by the plasma scattering etching process step, second. The purpose of the present invention is to remove the residual material from the cavity to thereby improve the quality of the semiconductor device.

As described above, since the etching process is proceeded by changing the property of the etching process itself, it contributes to a simplification of the process and an improvement of the productivity.

The first etching process and the second plasma scattering etching process are known. The present invention is embodied in the sequence, as claimed.

The foregoing description of the preferred embodiment has been presented for the purpose of illustration and description. It is not intended to limit the scope of the invention. Many modifications and variations are possible in the light of the above teaching. It is intended that the scope of the invention be defined by the claims.

What is claimed is:

1. A method for removing residual material which remains in a cavity after an anisotropic etching process in the manufacture of a partially completed multi-layer semiconductor device, the cavity being in contact with at least one anisotropic etch-stop layer and where the cavity is accessible by an etchable layer, said method comprising the steps of:

providing a plasma etching apparatus having a chamber:

etching the etchable layer by anisotropic etching utilizing the plasma etching apparatus under predetermined conditions in the chamber of the plasma etching apparatus until a top of the etch-stop layer is exposed; and, performing a plasma scattering etching process to remove the residual material in the cavity by changing the predetermined conditions of the anisotropic etching process to produce plasma scattering upon completion of the exposure of the top of the etch-stop layer, thereby removing the residual material from the cavity.

2. The method of claim 1 whrein the predetermined conditions of the anisotropic etching process utilizing plasma gas are: chamber pressure of 280 m Torr, chamber RF power supply of 250 watt and a chamber mixture of gases being in a ratio of 100:150 ($CCL_4$:He).

3. The method of claim 1 wherein the predetermined conditions are changed to enable performance of the plasma scattering etching process by providing: a chamber pressure of 300 m Torr, a chamber RF power supply of 250 watt and a chamber mixture of gases being in a ratio of 100:150:6 ($CCL_4$:$SE_6$), in the chamber.

4. A method for removing residual material which remains in a cavity after an anisotropic etching process in the manufacture of a partially completed multi-layer semiconductor device, the cavity being in contact with at least one anisotropic etch-stop layer and where the cavity is accessible by an etchable layer, said method comprising:

providing a plasma etching apparatus having a chamber;

etching the etchable layer by anisotropic etching utilizing the plasma etching apparatus until a top of the etch-stop layer is exposed wherein the predetermined conditions in the chamber of the anisotropic etching process utilizing plasma gas are: chamber pressure of 280 m Torr, chamber RF power supply of 250 watt and a chamber mixture of gases being in a ratio of 100:150 ($CCL_4$:He); and, performing a plasma scattering etching process to remove the residual material in the cavity by changing the predetermined conditions of the etching process to: a chamber pressure of 300 m Torr, a chamber RF power supply of 250 watt and a chamber mixture of gases being in a ratio of 100:150:6 ($CCL_4$:He:$SE_6$) thereby producing the plasma scattering effect whereby the residual material is removed from the cavity.

* * * * *